US012645108B2

(12) United States Patent
Mizuno et al.

(10) Patent No.: US 12,645,108 B2
(45) Date of Patent: Jun. 2, 2026

(54) LIGHT DETECTION ELEMENT

(71) Applicant: TDK CORPORATION, Tokyo (JP)

(72) Inventors: Tomohito Mizuno, Tokyo (JP);
Hideaki Fukuzawa, Tokyo (JP);
Tetsuya Shibata, Tokyo (JP)

(73) Assignee: TDK CORPORATION, Tokyo (JP)

( * ) Notice: Subject to any disclaimer, the term of this
patent is extended or adjusted under 35
U.S.C. 154(b) by 650 days.

(21) Appl. No.: 18/073,077

(22) Filed: Dec. 1, 2022

(65) Prior Publication Data

US 2023/0194913 A1    Jun. 22, 2023

(30) Foreign Application Priority Data

Dec. 17, 2021    (JP) ................................. 2021-205174

(51) Int. Cl.
*G02F 1/09* (2006.01)
*H10F 77/40* (2025.01)

(52) U.S. Cl.
CPC ............. *G02F 1/09* (2013.01); *H10F 77/413*
(2025.01)

(58) Field of Classification Search
CPC .......... G02F 1/09; H10F 77/413; H10F 30/20;
H10F 77/206; H10F 77/244; H10F 77/20;
H10F 30/10
See application file for complete search history.

(56) References Cited

U.S. PATENT DOCUMENTS

| | | |
|---|---|---|
| 5,723,978 A | 3/1998 | Inomata et al. |
| 6,925,261 B2 | 8/2005 | Haruyama |
| 8,274,052 B1 * | 9/2012 | Fukuzawa .......... G01N 21/3581 |
| | | 250/341.1 |
| 9,842,874 B2 | 12/2017 | Nakata |
| 2001/0040713 A1 | 11/2001 | Haruyama |
| 2015/0333839 A1 | 11/2015 | Li et al. |
| 2019/0088395 A1 * | 3/2019 | Ota ..................... H01F 10/3254 |

FOREIGN PATENT DOCUMENTS

| | | |
|---|---|---|
| CN | 114497116 A | 5/2022 |
| CN | 114497268 A | 5/2022 |
| CN | 114812627 A | 7/2022 |
| CN | 114910105 A | 8/2022 |
| JP | H07-235418 A | 9/1995 |
| JP | H08-078703 A | 3/1996 |
| JP | 2001-292107 A | 10/2001 |
| JP | 2012-023400 A | 2/2012 |
| JP | 2014-120629 A | 6/2014 |

OTHER PUBLICATIONS

Jun-Yang Chen et al. "All-Optical Switching of Magnetic Tunnel
Junctions With Single Subpicosecond Laser Pulses". Physical Review
Applied, 2017, vol. 7, pp. 021001.
Zubair Al Azim et al. "Optical Receiver With Helicity-Dependent
Magnetization Reversal". IEEE Transactions on Magnetics, Jan.
2019, vol. 55, No. 1.
Translation of Apr. 3, 2026 Office Action issued in Chinese Patent
Application No. 202211546866.3.

* cited by examiner

*Primary Examiner* — Tony Ko
*Assistant Examiner* — Mai Thi Ngoc Tran
(74) *Attorney, Agent, or Firm* — Oliff PLC

(57) ABSTRACT

The light detection element includes a light-sensitive layer
configured to generate a voltage when light is applied, a first
electrode, and a second electrode. The light-sensitive layer
is located between the first electrode and the second elec-
trode. The second electrode is a metal containing at least one
element selected from the group consisting of ruthenium,
molybdenum, and tungsten.

6 Claims, 11 Drawing Sheets

LIGHT DETECTION ELEMENT

BACKGROUND

The disclosure relates to a light detection element. Priority is claimed on Japanese Patent Application No. 2021-205174, filed Dec. 17, 2021, the content of which is incorporated herein by reference.

Photoelectric conversion elements are used for various purposes.

For example, Patent Document 1 describes a receiving device that receives an optical signal using a photodiode. The photodiode is, for example, a pn junction diode using a semiconductor pn junction or the like. Also, for example, Patent Document 2 discloses a light sensor using a semiconductor pn junction and an image sensor using the light sensor.

Patent Documents

[Patent Document 1] Japanese Unexamined Patent Application, First Publication No. 2001-292107
[Patent Document 2] U.S. Pat. No. 9,842,874

SUMMARY

Although light detection elements using semiconductor pn junctions are widely used, new light detection elements are required for further development. Also, a light detection element converts light into electrical signals and there is a need for a light detection element with a high efficiency and a high light detection capability in converting light into electrical signals.

It is desirable to provide a light detection element having a high light detection capability. The following means are provided.

A light detection element including: a light-sensitive layer configured to generate a voltage when light is applied; a first electrode; and a second electrode, wherein the light-sensitive layer is located between the first electrode and the second electrode, and the second electrode is a metal containing at least one element selected from the group consisting of ruthenium, molybdenum, and tungsten.

DETAILED DESCRIPTION

Figure 1:
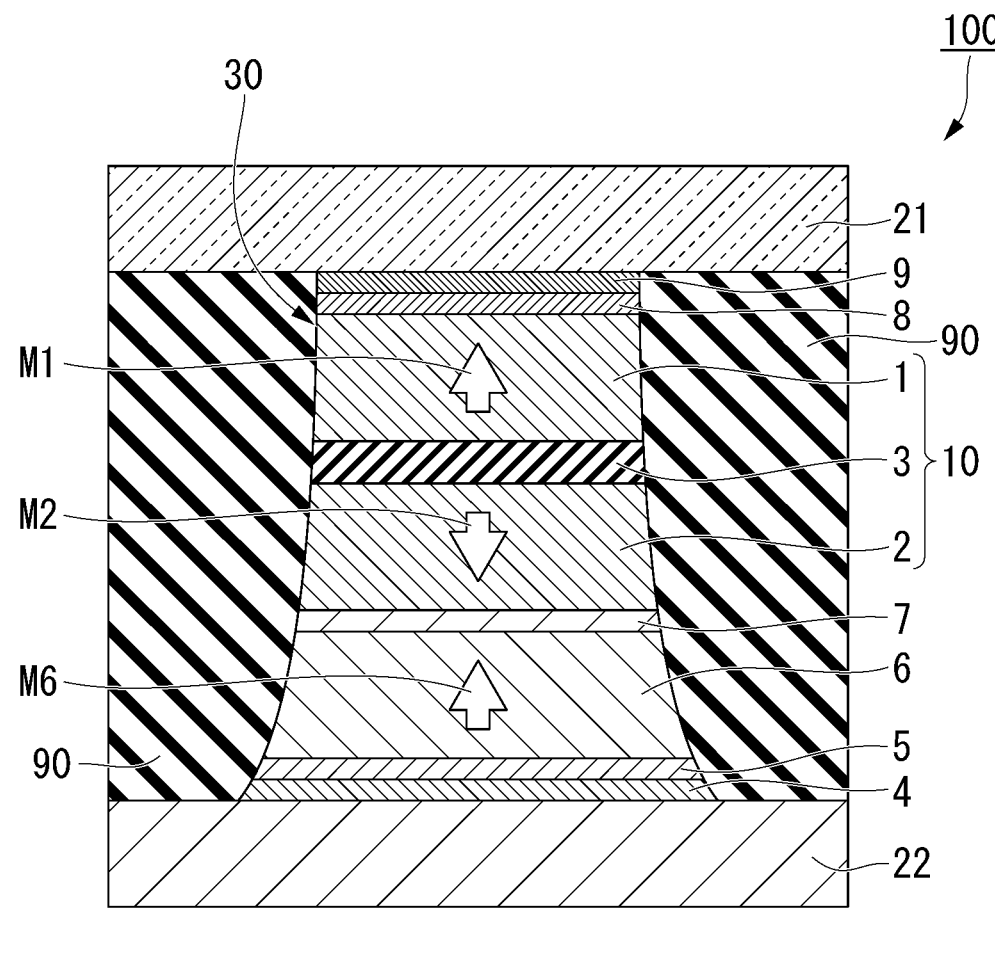
FIG. 1 is a cross-sectional view of a light detection element according to a first embodiment.
Figure 1:
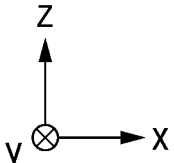

Hereinafter, present embodiments will be described in detail with reference to the drawings as appropriate. In the drawings used in the following description, featured parts may be enlarged for convenience such that the features of the disclosure are easier to understand, and dimensional ratios and the like of the respective components may be different from actual ones. Materials, dimensions, and the like exemplified in the following description are examples, the disclosure is not limited thereto, and modifications can be appropriately made in a range in which advantageous effects of the disclosure are exhibited.

Directions will be defined. A lamination direction of a light detection element 100 is defined as a z-direction, one direction within a plane orthogonal to the z-direction is defined as an x-direction, and a direction orthogonal to the x-direction and the z-direction is defined as a y-direction. The z-direction is an example of the lamination direction. Hereinafter, a +z-direction may be expressed as an "upward" direction and a −z-direction may be expressed as a "downward" direction. The +z-direction is a direction from a second electrode 22 to a first electrode 21. The upward and downward directions do not always coincide with a direction in which gravity is applied.

First Embodiment

FIG. 1 is a cross-sectional view of the light detection element 100 according to the first embodiment. In FIG. 1, a direction of magnetization in an initial state of a ferromagnetic material is indicated by an arrow.

The light detection element 100 includes a light-sensitive layer 10, a first electrode 21, and a second electrode 22. The light-sensitive layer 10 is located between the first electrode 21 and the second electrode 22. In addition, the light detection element 100 may have a buffer layer 4, a seed layer 5, a third ferromagnetic layer 6, a magnetic coupling layer 7, a perpendicular magnetization inducing layer 8, a cap layer 9, and an insulating layer 90. The buffer layer 4, the seed layer 5, the third ferromagnetic layer 6, and the magnetic coupling layer 7 are located between the light-sensitive layer 10 and the second electrode 22 and the perpendicular magnetization inducing layer 8 and the cap layer 9 are located between the light-sensitive layer 10 and the first electrode 21. The insulating layer 90 is located between the first electrode 21 and the second electrode 22 and covers the periphery of a laminate 30 including the light-sensitive layer 10.

The light detection element 100 replaces a state or a change in a state of applied light with an electrical signal. The light in the present specification is not limited to a visible light ray and also includes an infrared ray having a wavelength longer than that of the visible light ray and an ultraviolet ray having a wavelength shorter than that of the visible light ray. The wavelength of the visible light ray is, for example, 380 nm or more and less than 800 nm. The wavelength of the infrared ray is, for example, 800 nm or more and 1 mm or less. The wavelength of the ultraviolet ray is, for example, 200 nm or more and less than 380 nm. For example, light having a wavelength of 400 nm or more and 1500 nm or less is applied to the light detection element 100 (the light-sensitive layer 10). Light having a wavelength of 400 nm or more and 1700 nm or less may be applied to the light detection element 100 (the light-sensitive layer 10).

The light-sensitive layer 10 generates a voltage when light is applied. When the state of the applied light changes, the light-sensitive layer 10 changes its resistance value in the z-direction in accordance with a change in the state of light. When the state of the light applied to the light-sensitive layer 10 changes, the output voltage from the light-sensitive layer 10 changes in accordance with the change in the state of the light. The light-sensitive layer 10 has, for example, a first ferromagnetic layer 1, a second ferromagnetic layer 2, and a spacer layer 3. The spacer layer 3 is located between the first ferromagnetic layer 1 and the second ferromagnetic layer 2. The light-sensitive layer 10 may have other layers in addition to these.

The light-sensitive layer 10 is a magnetic element containing a ferromagnetic material. For example, when the spacer layer 3 is made of an insulator, the light-sensitive layer 10 has a magnetic tunnel junction (MTJ) consisting of the first ferromagnetic layer 1, the spacer layer 3, and the second ferromagnetic layer 2. This element is referred to as an MTJ element. In this case, the light-sensitive layer 10 can exhibit a tunnel magnetoresistance (TMR) effect. When the spacer layer 3 is made of a metal, the light-sensitive layer 10 can exhibit a giant magnetoresistance (GMR) effect. This element is referred to as a GMR element. The light-sensitive layer 10 may be referred to as an MTJ element, a GMR element, or the like using a constituent material of the spacer layer 3, but is also generically referred to as a magnetoresistance effect element. In the light-sensitive layer 10, a resistance value in the z-direction (a resistance value when a current has been applied in the z-direction) changes in accordance with the relative change in the state of magnetization of the first ferromagnetic layer 1 and the state of magnetization of the second ferromagnetic layer 2.

The first ferromagnetic layer 1 is a light detection layer whose magnetization state changes when light is applied from the outside. The first ferromagnetic layer 1 is also referred to as a magnetization free layer. The magnetization free layer is a layer containing a magnetic material whose magnetization state changes when prescribed external energy has been applied. The prescribed external energy is, for example, light applied from the outside, a current flowing through the light-sensitive layer 10 in the z-direction, or an external magnetic field. The state of the magnetization of the first ferromagnetic layer 1 changes in accordance with the intensity of the light applied to the first ferromagnetic layer 1 (the light applied to the light-sensitive layer 10).

The first ferromagnetic layer 1 includes a ferromagnetic material. The first ferromagnetic layer 1 includes, for example, at least one of magnetic elements such as Co, Fe, and Ni. The first ferromagnetic layer 1 may include B, Mg, Hf, and Gd together with the above-described magnetic elements. The first ferromagnetic layer 1 may be, for example, an alloy including a magnetic element and a nonmagnetic element. The first ferromagnetic layer 1 may include a plurality of layers. The first ferromagnetic layer 1 is, for example, a CoFeB alloy, a laminate in which a CoFeB alloy layer is sandwiched between Fe layers, and a laminate in which a CoFeB alloy layer is sandwiched between CoFe layers. Generally, "ferromagnetism" includes "ferrimagnetism." The first ferromagnetic layer 1 may exhibit ferrimagnetism. On the other hand, the first ferromagnetic layer 1 may exhibit ferromagnetism that is not ferrimagnetism. For example, CoFeB alloys exhibit ferromagnetism that is not ferrimagnetism.

The first ferromagnetic layer 1 may be an in-plane magnetization film having an axis of easy magnetization in a direction within a film surface (any one direction within the xy-plane) or may be a perpendicular magnetization film having an axis of easy magnetization in a direction perpendicular to the film surface (the z-direction).

A thickness of the first ferromagnetic layer 1 is, for example, 1 nm or more and 5 nm or less. The thickness of the first ferromagnetic layer 1 may be, for example, 1 nm or more and 2 nm or less. If the thickness of the first ferromagnetic layer 1 is thin when the first ferromagnetic layer 1 is a perpendicular magnetization film, the effect of applying perpendicular magnetic anisotropy from the layers above and below the first ferromagnetic layer 1 is strengthened and perpendicular magnetic anisotropy of the first ferromagnetic layer 1 increases. That is, when the perpendicular magnetic anisotropy of the first ferromagnetic layer 1 increases, a force for the magnetization M1 to return in the z-direction is strengthened. On the other hand, when the thickness of the first ferromagnetic layer 1 is thick, the effect of applying the perpendicular magnetic anisotropy from the layers above and below the first ferromagnetic layer 1 is relatively weakened and the perpendicular magnetic anisotropy of the first ferromagnetic layer 1 is weakened.

The volume of a ferromagnet becomes small when the thickness of the first ferromagnetic layer 1 becomes thin. The volume of a ferromagnet becomes large when the thickness of the first ferromagnetic layer 1 becomes thick. The susceptibility of the magnetization of the first ferromagnetic layer 1 when external energy has been applied is inversely proportional to a product (KuV) of the magnetic anisotropy (Ku) and the volume (V) of the first ferromagnetic layer 1. That is, when the product of the magnetic anisotropy and the volume of the first ferromagnetic layer 1 becomes small, the reactivity to light increases. From this point of view, to increase the reaction to light, the magnetic anisotropy of the first ferromagnetic layer 1 may be appropriately designed and then the volume of the first ferromagnetic layer 1 may be reduced.

When the thickness of the first ferromagnetic layer 1 is thicker than 2 nm, an insertion layer made of, for example, Mo and W may be provided within the first ferromagnetic layer 1. That is, the first ferromagnetic layer 1 may be a laminate in which the ferromagnetic layer, the insertion layer, and the ferromagnetic layer are laminated in that order in the z-direction. Interfacial magnetic anisotropy at an interface between the insertion layer and the ferromagnetic layer enhances the perpendicular magnetic anisotropy of the entire first ferromagnetic layer 1. A thickness of the insertion layer is, for example, 0.1 nm to 1.0 nm.

The second ferromagnetic layer 2 is a magnetization fixed layer. The magnetization fixed layer is a layer made of a magnet whose magnetization state is less likely to change than that of the magnetization free layer when prescribed external energy has been applied. For example, in the magnetization fixed layer, a direction of magnetization is less likely to change than that in the magnetization free layer when prescribed external energy has been applied. Also, for example, in the magnetization fixed layer, a magnitude of magnetization is less likely to change than that in the magnetization free layer when prescribed external energy is applied. For example, coercivity of the second ferromagnetic layer 2 is greater than that of the first ferromagnetic layer 1. The second ferromagnetic layer 2 has an axis of easy magnetization in the same direction as the first ferromagnetic layer 1. The second ferromagnetic layer 2 may be either an in-plane magnetization film or a perpendicular magnetization film.

For example, the material constituting the second ferromagnetic layer 2 is similar to that of the first ferromagnetic layer 1. The second ferromagnetic layer 2 may be, for example, a multilayer film in which Co having a thickness of 0.4 nm to 1.0 nm and Pt having a thickness of 0.4 nm to 1.0 nm are alternately laminated several times. The second ferromagnetic layer 2 may be, for example, a laminate in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are laminated in that order.

The magnetization of the second ferromagnetic layer 2 may be fixed, for example, through magnetic coupling with the third ferromagnetic layer 6 sandwiching the magnetic coupling layer 7. In this case, a combination of the second ferromagnetic layer 2, the magnetic coupling layer 7, and the third ferromagnetic layer 6 may be referred to as a magnetization fixed layer. Details of the magnetic coupling layer 7 and the third ferromagnetic layer 6 will be described below.

The spacer layer 3 is a layer arranged between the first ferromagnetic layer 1 and the second ferromagnetic layer 2. The spacer layer 3 includes a layer made of a conductor, an insulator, or a semiconductor or a layer including a current carrying point formed of a conductor within an insulator. The spacer layer 3 is, for example, a nonmagnetic layer. A thickness of the spacer layer 3 can be adjusted in accordance with orientation directions of the magnetization of the first ferromagnetic layer 1 and the magnetization of the second ferromagnetic layer 2 in an initial state to be described below.

When the spacer layer 3 is made of an insulating material, materials including aluminum oxide, magnesium oxide, titanium oxide, silicon oxide, and the like can be used. Also, these insulating materials may include elements such as Al, B, Si, and Mg and magnetic elements such as Co, Fe, and Ni. A high magnetoresistance change rate can be obtained by adjusting the thickness of the spacer layer 3 so that a strong TMR effect is exhibited between the first ferromagnetic layer 1 and the second ferromagnetic layer 2. In order to use the TMR effect efficiently, the thickness of the spacer layer 3 may be about 0.5 to 5.0 nm or about 1.0 to 2.5 nm.

When the spacer layer 3 is made of a nonmagnetic conductive material, a conductive material such as Cu, Ag, Au, or Ru can be used. In order to use the GMR effect efficiently, the thickness of the spacer layer 3 may be about 0.5 to 5.0 nm or about 2.0 to 3.0 nm.

When the spacer layer 3 is made of a nonmagnetic semiconductor material, a material such as zinc oxide, indium oxide, tin oxide, germanium oxide, gallium oxide, or indium tin oxide (ITO) can be used. In this case, the thickness of the spacer layer 3 may be about 1.0 to 4.0 nm.

When a layer including a current carrying point made of a conductor within a nonmagnetic insulator is applied as the spacer layer 3, a structure may be formed to include a current carrying point made of a nonmagnetic conductor of Cu, Au, Al, or the like within the nonmagnetic insulator made of aluminum oxide or magnesium oxide. Also, the conductor may be made of a magnetic element such as Co, Fe, or Ni. In this case, the thickness of the spacer layer 3 may be about 1.0 to 2.5 nm. The current carrying point is, for example, a columnar body having a diameter of 1 nm or more and 5 nm or less when viewed from a direction perpendicular to a film surface.

The third ferromagnetic layer 6 is magnetically coupled to, for example, the second ferromagnetic layer 2. The magnetic coupling is, for example, antiferromagnetic coupling and is caused by Ruderman-Kittel-Kasuya-Yosida (RKKY) interaction. The material constituting the third ferromagnetic layer 6 is, for example, similar to that of the first ferromagnetic layer 1.

The magnetic coupling layer 7 is located between the second ferromagnetic layer 2 and the third ferromagnetic layer 6. The magnetic coupling layer 7 is, for example, Ru, Ir, or the like.

The buffer layer 4 is a layer that relaxes lattice mismatch between different crystals. The buffer layer 4 contains, for example, a metal containing at least one element selected from the group consisting of Ta, Ti, Zr, and Cr or a nitride containing at least one element selected from the group consisting of Ta, Ti, Zr, and Cu. More specifically, the buffer layer 4 is, for example, Ta (single substance), a NiCr alloy, tantalum nitride (TaN), or copper nitride (CuN). The film thickness of the buffer layer 4 is, for example, 1 nm or more and 5 nm or less. The buffer layer 4 is, for example, amorphous. The buffer layer 4 is located, for example, between the seed layer 5 and the second electrode 22 and comes into contact with the second electrode 22. The buffer layer 4 prevents the crystal structure of the second electrode 22 from affecting the crystal structure of the light-sensitive layer 10.

The seed layer 5 enhances the crystallinity of the layer laminated on the seed layer 5. For example, the seed layer 5 is located between the buffer layer 4 and the third ferromagnetic layer 6 and is on the buffer layer 4. The seed layer 5 is, for example, Pt, Ru, Hf, Zr, or NiFeCr. A thickness of the seed layer 5 is, for example, 1 nm or more and 5 nm or less.

The cap layer 9 is between the first ferromagnetic layer 1 and the first electrode 21. The cap layer 9 may include a perpendicular magnetization inducing layer 8 that is laminated on the first ferromagnetic layer 1 and comes into contact with the first ferromagnetic layer 1. The cap layer 9 prevents damage to the lower layer during the process and enhances the crystallinity of the lower layer during annealing. The thickness of the cap layer 9 is, for example, 10 nm or less such that sufficient light is applied to the first ferromagnetic layer 1.

The perpendicular magnetization inducing layer 8 induces perpendicular magnetic anisotropy of the first ferromagnetic layer 1. The perpendicular magnetization inducing layer 8 is, for example, magnesium oxide, W, Ta, Mo, or the like. When the perpendicular magnetization inducing layer 8 is magnesium oxide, the magnesium oxide may be oxygen-deficient to increase conductivity. A thickness of the perpendicular magnetization inducing layer 8 is, for example, 0.5 nm or more and 5.0 nm or less.

The insulating layer 90 is, for example, an oxide, a nitride, or an oxynitride of Si, Al, or Mg. The insulating layer 90 is, for example, silicon oxide ($SiO_x$), silicon nitride ($SiN_x$), silicon carbide (SiC), chromium nitride, silicon nitride (SiCN), silicon oxynitride (SiON), aluminum oxide (Al$_2$O$_3$), and zirconium oxide (ZrO$_x$), or the like.

The first electrode 21 is arranged on the side of the light detection element 100 on which incident light is incident. The incident light is applied from the first electrode 21 side to the light-sensitive layer 10. The first electrode 21 is made of a conductive material. The first electrode 21 is, for example, a transparent electrode having transparency to light in a used wavelength range. The first electrode 21 may transmit, for example, 80% or more of the light in the used wavelength range. The used wavelength range of light is, for example, 300 nm or more and 2 μm or less, may be 400 nm or more and 1500 nm or less. The first electrode 21 is, for example, an oxide such as indium tin oxide (ITO), indium zinc oxide (IZO), zinc oxide (ZnO), or indium gallium zinc oxide (IUZO). The first electrode 21 may be configured to have a plurality of columnar metals among transparent electrode materials of these oxides. Also, the first electrode 21 may have an antireflection film on an irradiation surface to which light is applied.

The second electrode 22 is made of a conductive material. The second electrode 22 is a metal containing at least one element selected from the group consisting of ruthenium, molybdenum, and tungsten. The second electrode 22 may be a single layer film of any one of ruthenium, molybdenum, and tungsten or may be a laminated film having at least one layer of any one of ruthenium, molybdenum, and tungsten. For example, the second electrode 22 may be a laminated film in which ruthenium and tungsten are alternately laminated, a laminated film in which ruthenium and molybdenum are alternately laminated, or a laminated film in which molybdenum and tungsten are alternately laminated.

Ruthenium, molybdenum, and tungsten have high melting points (2000° C. or higher) and excellent heat resistance. The second electrode 22 containing these elements is less likely to deteriorate even if heat treatment when the light-sensitive layer 10 is crystallized and heat treatment in a semiconductor process are performed.

The second electrode 22 reflects a part of the incident light incident from the first electrode 21 side on the interface between the layers in contact with the second electrode 22 (an interface between the buffer layer 4 and the second electrode 22 and an interface between the insulating layer 90 and the second electrode 22). Ruthenium, molybdenum, and tungsten have high light reflectance on their interface, and particularly high light reflectance at wavelengths of 400 nm or more and 1500 nm or less on their interface. The light reflected by the second electrode 22 is applied to the light-sensitive layer 10. Because the second electrode 22 is made of a prescribed material (a metal containing at least one element selected from the group consisting of ruthenium, molybdenum, and tungsten), more incident light is reflected when it is not the prescribed material. Thus, in the light detection element 100, the amount of light applied to the light-sensitive layer 10 is large.

The light detection element 100 is manufactured in a layer lamination process, an annealing process, and a processing process. First, the buffer layer 4, the seed layer 5, the third ferromagnetic layer 6, the magnetic coupling layer 7, the second ferromagnetic layer 2, the spacer layer 3, the first ferromagnetic layer 1, the perpendicular magnetization inducing layer 8, and the cap layer 9 are laminated on the second electrode 22 in that order. For example, each layer is formed through sputtering.

Subsequently, the laminated film is annealed. An annealing temperature is, for example, 250° C. or higher and 400° C. or lower. Subsequently, the laminated film is processed into the laminate 30 having a columnar shape through photolithography and etching. The laminate 30 may be cylindrical or prismatic. For example, the shortest width of the laminate 30 when viewed in the z-direction is 10 nm or more and 1000 nm or less.

Subsequently, the insulating layer 90 is formed to cover the side surface of the laminate 30. The insulating layer 90 may be laminated multiple times. Subsequently, the upper surface of the cap layer 9 is exposed from the insulating layer 90 through chemical mechanical polishing and the first electrode 21 is produced on the cap layer 9. In the above-described process, the light detection element 100 is obtained.

Next, some examples of the operation of the light detection element 100 will be described. Light whose intensity changes is applied to the light-sensitive layer 10. An output voltage from the light detection element 100 changes with a change in the intensity of light applied to the light-sensitive layer 10. For example, the change in the resistance value of the light-sensitive layer 10 contributes to the change in the output voltage from the light detection element 100. In the first operation example, the case where the intensities of the light applied to the light-sensitive layer 10 are two levels of a first intensity and a second intensity will be described. The intensity of light of the second intensity is set to be greater than the intensity of light of the first intensity. The first intensity may correspond to the case where the intensity of light applied to the light-sensitive layer 10 is zero.

Figure 2:
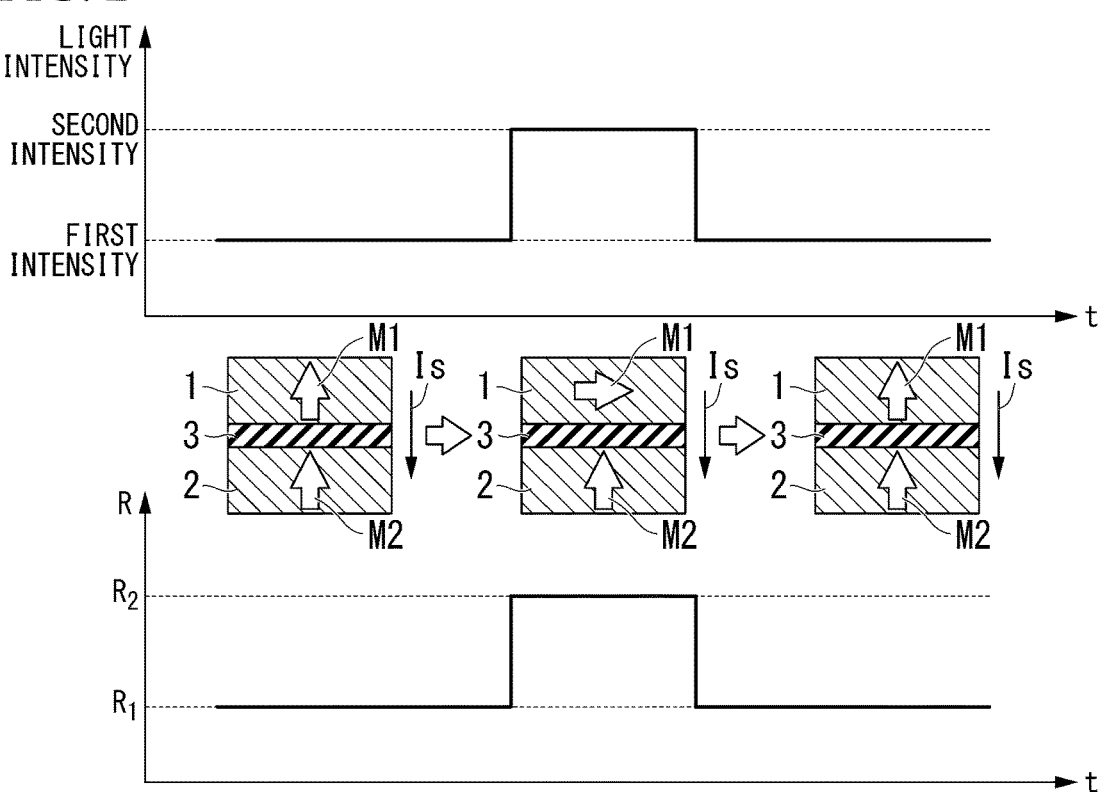
FIG. 2 is a diagram for describing a first mechanism of a first operation example of the light detection element according to the first embodiment.
Figure 3:
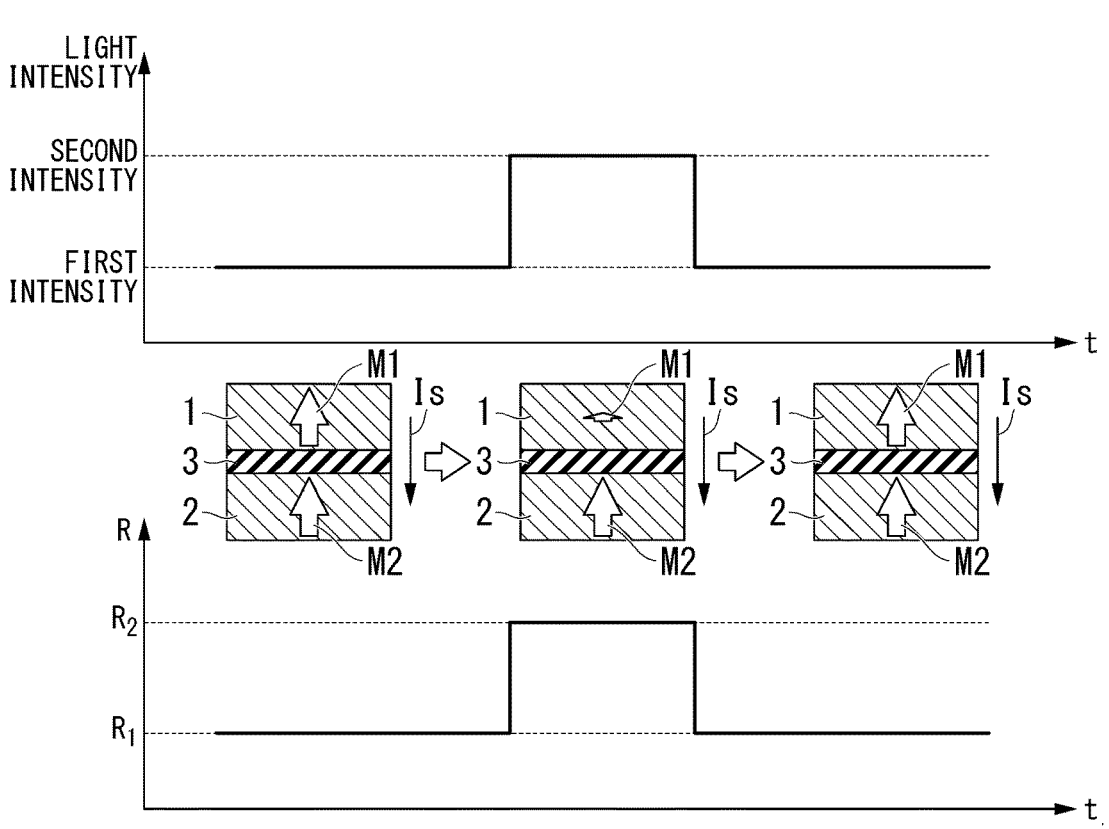
FIG. 3 is a diagram for describing a second mechanism of the first operation example of the light detection element according to the first embodiment.

FIGS. 2 and 3 are diagrams for describing a first operation example of the light detection element 100 according to the first embodiment. FIG. 2 is a diagram for describing a first mechanism of the first operation example and FIG. 3 is a diagram for describing a second mechanism of the first operation example. In FIGS. 2 and 3, only the light-sensitive layer 10 of the light detection element 100 is extracted and illustrated. In the upper graphs of FIGS. 2 and 3, the vertical axis represents an intensity of light applied to the light-sensitive layer 10 and the horizontal axis represents time. In the lower graphs of FIGS. 2 and 3, the vertical axis represents a resistance value of the light detection element 100 in the z-direction and the horizontal axis represents time.

First, in a state in which light of the first intensity is applied to the light-sensitive layer 10 (hereinafter referred to as an initial state), magnetization M1 of the first ferromagnetic layer 1 is parallel to magnetization M2 of the second ferromagnetic layer 2 and a resistance value of the light detection element 100 in the z-direction is a first resistance value $R_1$, and a magnitude of an output voltage from the light detection element 100 indicates a first value. The resistance value of the light detection element 100 in the z-direction is obtained by causing a sense current Is to flow through the light detection element 100 in the z-direction to generate a voltage across both ends of the light detection element 100 in the z-direction and using Ohm's law from a voltage value. An output voltage from the light detection element 100 is generated between the first electrode 21 and the second electrode 22. In the case of the example shown in FIG. 2, the sense current Is flows in a direction from the first ferromagnetic layer 1 to the second ferromagnetic layer 2. By causing the sense current is to flow in the above direction, spin-transfer torque in a direction, which is the same as that of the magnetization M2 of the second ferromagnetic layer 2, acts on the magnetization M1 of the first ferromagnetic layer 1, and the magnetization M1 becomes parallel to the magnetization M2 in the initial state. Also, it is possible to prevent the magnetization M1 of the first ferromagnetic layer 1 from being inverted during operation by causing the sense current Is to flow in the above direction.

Next, the intensity of the light applied to the light-sensitive layer 10 changes from the first intensity to the second intensity. The second intensity is greater than the first intensity and the magnetization M1 of the first ferromagnetic layer 1 changes from the initial state. The state of the magnetization M1 of the first ferromagnetic layer 1 in the state in which no light is applied to the light-sensitive layer 10 is different from the state of the magnetization M1 of the first ferromagnetic layer 1 in the second intensity. The state of the magnetization M1 is, for example, a tilt angle with respect to the z-direction, a magnitude, or the like.

For example, as shown in FIG. 2, when the intensity of the light applied to the light-sensitive layer 10 changes from the first intensity to the second intensity, the magnetization M1 is tilted in the z-direction. Also, for example, as shown in FIG. 3, when the intensity of the light applied to the light-sensitive layer 10 changes from the first intensity to the second intensity, the magnitude of the magnetization M1 becomes small. For example, when the magnetization M1 of the first ferromagnetic layer 1 is tilted in the z-direction due to an intensity of the applied light, a tilt angle thereof is larger than 0° and smaller than 90°.

When the magnetization M1 of the first ferromagnetic layer 1 changes from the initial state, the resistance value of the light detection element 100 in the z-direction is a second resistance value $R_2$ and a magnitude of the output voltage from the light detection element 100 is a second value. The second resistance value $R_2$ is larger than the first resistance value $R_1$ and the second value of the output voltage is larger than the first value. The second resistance value $R_2$ is between the resistance value (the first resistance value $R_1$) when the magnetization M1 and the magnetization M2 are parallel and the resistance value when the magnetization M1 and the magnetization M2 are antiparallel.

In the case shown in FIG. 2, spin-transfer torque in a direction, which is the same as that of the magnetization M2 of the second ferromagnetic layer 2, acts on the magnetization M1 of the first ferromagnetic layer 1. Therefore, the magnetization M1 tries to return to a state in which the magnetization M1 is parallel to the magnetization M2 and the light detection element 100 returns to the initial state when the intensity of the light applied to the light-sensitive layer 10 changes from the second intensity to the first intensity. In the case shown in FIG. 3, when the intensity of the light applied to the light-sensitive layer 10 returns to the first intensity, the magnitude of the magnetization M1 of the first ferromagnetic layer 1 returns to the original magnitude and the light detection element 100 returns to the initial state. In either case, the resistance value of the light detection element 100 in the z-direction returns to the first resistance value That is, when the intensity of the light applied to the light-sensitive layer 10 changes from the second intensity to the first intensity, the resistance value of the light detection element 100 in the z-direction changes from the second resistance value $R_2$ to the first resistance value $R_1$ and the magnitude of the output voltage from the light detection element 100 changes from the second value to the first value.

The output voltage from the light detection element 100 changes in correspondence with a change in the intensity of the light applied to the light-sensitive layer 10 and the change in the intensity of the applied light can be transformed into a change in the output voltage from the light detection element 100. That is, the light detection element 100 can replace the light with an electrical signal. For example, the case where the output voltage from the light detection element 100 is greater than or equal to a threshold value is treated as a first signal (for example, "1") and the case where the output voltage is less than the threshold value is treated as a second signal (for example, "0").

Although the case where the magnetization M1 is parallel to the magnetization M2 in the initial state has been described as an example here, the magnetization M1 may be antiparallel to the magnetization M2 in the initial state. In this case, the resistance value of the light detection element 100 in the z-direction decreases as the state of the magnetization M1 changes (for example, as the change in the angle of the magnetization M1 increases from the initial state). When the initial state is the case where the magnetization M1 is antiparallel to the magnetization M2, the sense current Is may flow in a direction from the second ferromagnetic layer 2 to the first ferromagnetic layer 1. By causing the sense current Is to flow in the above direction, spin-transfer torque in a direction opposite to that of the magnetization M2 of the second ferromagnetic layer 2 acts on the magnetization M1 of the first ferromagnetic layer 1 and the magnetization M1 becomes antiparallel to the magnetization M2 in the initial state.

In the first operation example, the case where the light applied to the light-sensitive layer 10 has two levels of the first intensity and the second intensity has been described as an example, but in the second operation example, the case where the intensity of the light applied to the light-sensitive layer 10 changes at multiple levels or in an analog manner will be described.

Figure 4:
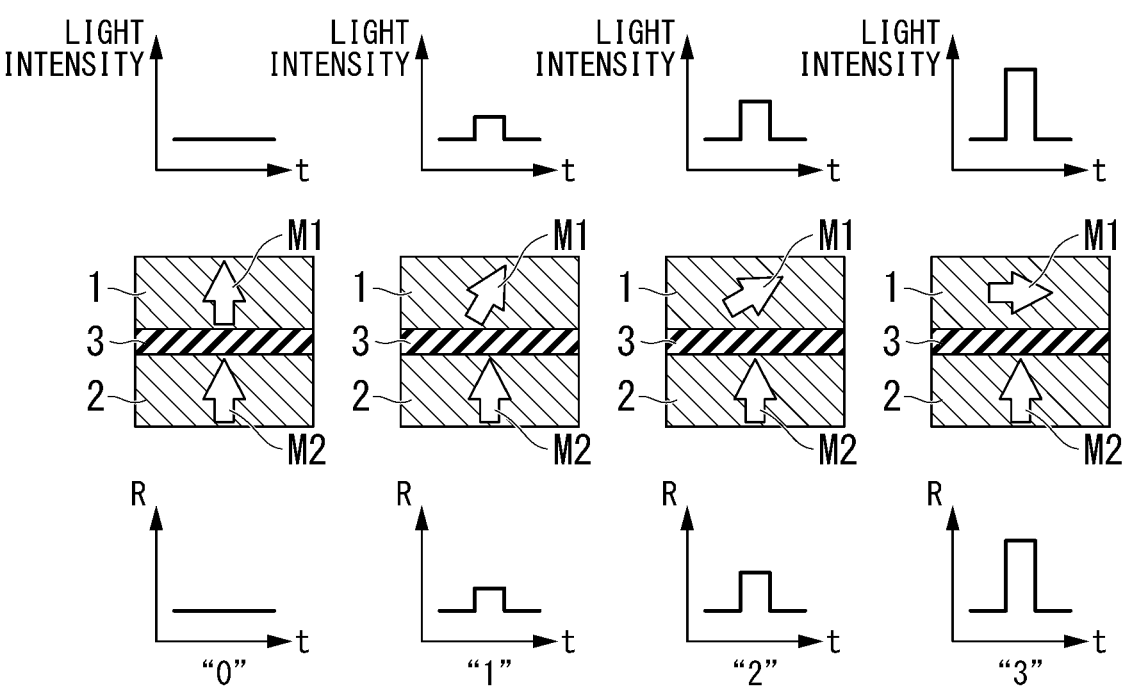
FIG. 4 is a diagram for describing a first mechanism of a second operation example of the light detection element according to the first embodiment.
Figure 5:
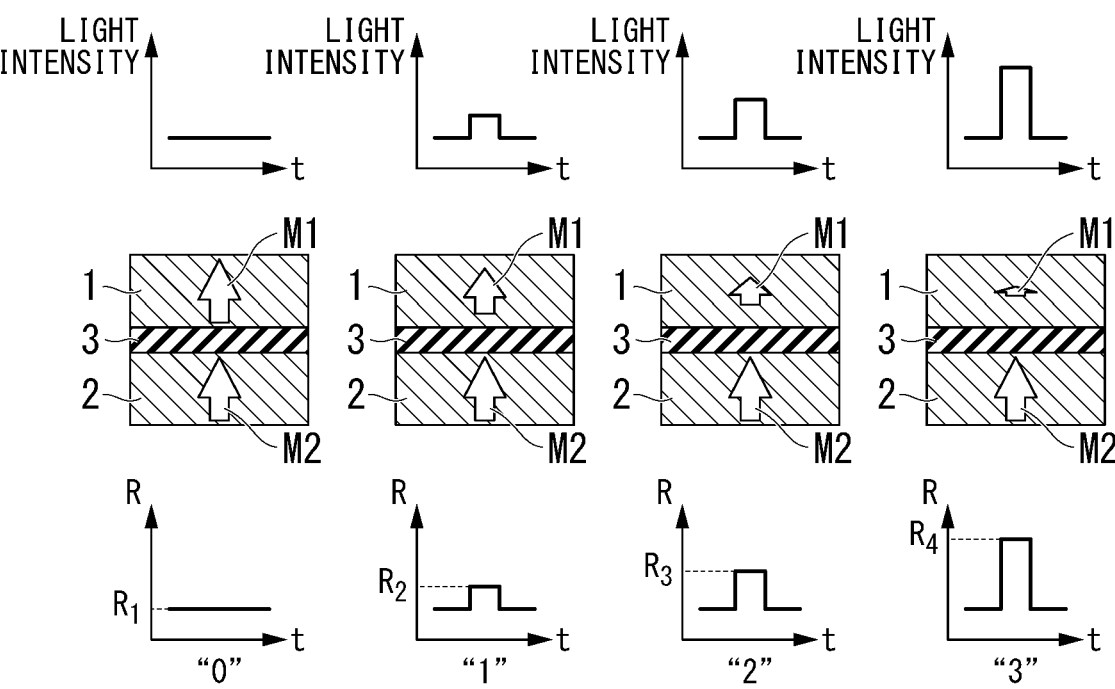
FIG. 5 is a diagram for describing a second mechanism of the second operation example of the light detection element according to the first embodiment.

FIGS. 4 and 5 are diagrams for describing a second operation example of the light detection element 100 according to the first embodiment. FIG. 4 is a diagram for describing a first mechanism of the second operation example and FIG. 5 is a diagram for describing a second mechanism of the second operation example. In FIGS. 4 and 5, only the light-sensitive layer 10 of the light detection element 100 is extracted and illustrated. In the upper graphs of FIGS. 4 and 5, the vertical axis represents an intensity of light applied to the light-sensitive layer 10 and the horizontal axis represents time. In the lower graphs of FIGS. 4 and 5, the vertical axis represents a resistance value of the light detection element 100 in the z-direction and the horizontal axis represents time.

In the case of FIG. 4, when the intensity of the light applied to the light-sensitive layer 10 increases, the magnetization M1 of the first ferromagnetic layer 1 is tilted from the initial state due to external energy generated by the application of the light. An angle between the direction of the magnetization M1 of the first ferromagnetic layer 1 when no light is applied to the first ferromagnetic layer 1 and the direction of the magnetization M1 when light is applied is greater than 0° and less than 90°.

When the magnetization M1 of the first ferromagnetic layer 1 is tilted from the initial state, the resistance value of the light detection element 100 in the z-direction changes. The output voltage from the light detection element 100 changes. For example, the resistance value of the light detection element 100 in the z-direction changes to a second resistance value $R_2$, a third resistance value $R_3$, and a fourth resistance value $R_4$ in accordance with the tilt of the magnetization M1 of the first ferromagnetic layer 1 and the output voltage from the light detection element 100 changes to a second value, a third value, and a fourth value. The resistance value increases in the order of the first resistance value $R_1$, the second resistance value $R_2$, the third resistance value $R_3$, and the fourth resistance value $R_4$. The output voltage from the light detection element 100 increases in the order of the first value, the second value, the third value, and the fourth value.

In the light detection element 100, when the intensity of the light applied to the light-sensitive layer 10 has changed, the output voltage from the light detection element 100 (the resistance value of the light detection element 100 in the z-direction) changes. For example, when the first value (the first resistance value $R_1$) is defined as "0," the second value (second resistance value $R_2$) is defined as "1," the third value (third resistance value $R_3$) is defined as "2," and the fourth value (fourth resistance value $R_4$) is defined as "3," the light detection element 100 can output information of four values. Although the case where four values are read is shown as an example here, the number of values to be read can be freely designed by setting the threshold value of the output voltage from the light detection element 100 (the resistance value of the light detection element 100). Also, the light detection element 100 may output an analog value as it is.

Likewise, in the case of FIG. 5, when the intensity of the light applied to the light-sensitive layer 10 increases, the magnitude of the magnetization M1 of the first ferromagnetic layer 1 decreases from the initial state due to external energy generated by the application of the light. When the magnetization M1 of the first ferromagnetic layer 1 decreases from the initial state, the resistance value of the light detection element 100 in the z-direction changes. The output voltage from the light detection element 100 changes. For example, in the accordance with the magnitude of the magnetization M1 of the first ferromagnetic layer 1, the resistance value of the light detection element 100 in the z-direction changes to a second resistance value $R_2$, a third resistance value $R_3$, and a fourth resistance value $R_4$ and the output voltage from the light detection element 100 changes to a second value, a third value, and a fourth value. Therefore, as in the case of FIG. 4, the light detection element 100 can output the difference in these output voltages (resistance values) as multivalued or analog data.

Even in the case of the second operation example, as in the first operation example, when the intensity of the light applied to the light-sensitive layer 10 returns to the first intensity, the state of the magnetization M1 of the first ferromagnetic layer 1 returns to the original state and the light detection element 100 returns to its initial state.

Although the case where the magnetization M1 and the magnetization M2 are parallel in the initial state has been described here as an example, the magnetization M1 and the magnetization M2 may be antiparallel in the initial state even in the second operation example.

Although the magnetization M1 and the magnetization M2 are parallel or antiparallel in the initial state in the first operation example and the second operation example, the magnetization M1 and the magnetization M2 may be orthogonal in the initial state. For example, this case corresponds to a case where the first ferromagnetic layer 1 is an in-plane magnetization film in which the magnetization M1 is oriented in any one direction of the xy-plane and the second ferromagnetic layer 2 is a perpendicular magnetization film in which the magnetization M2 is oriented in the z-direction. Due to the magnetic anisotropy, the magnetization M1 is oriented in any one direction within the xy-plane and the magnetization M2 is oriented in the z-direction, such that the magnetization M1 and the magnetization M2 are orthogonal to each other in the initial state.

Figure 6:
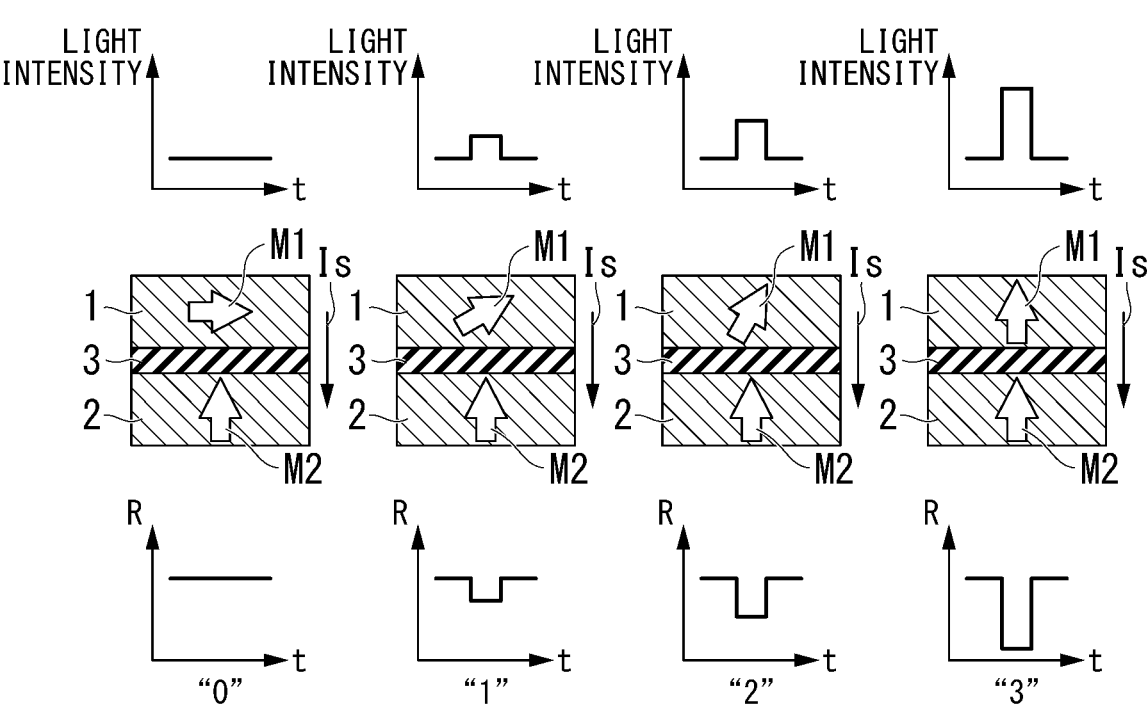
FIG. 6 is a diagram for describing another example of the second operation example of the light detection element according to the first embodiment.
Figure 7:
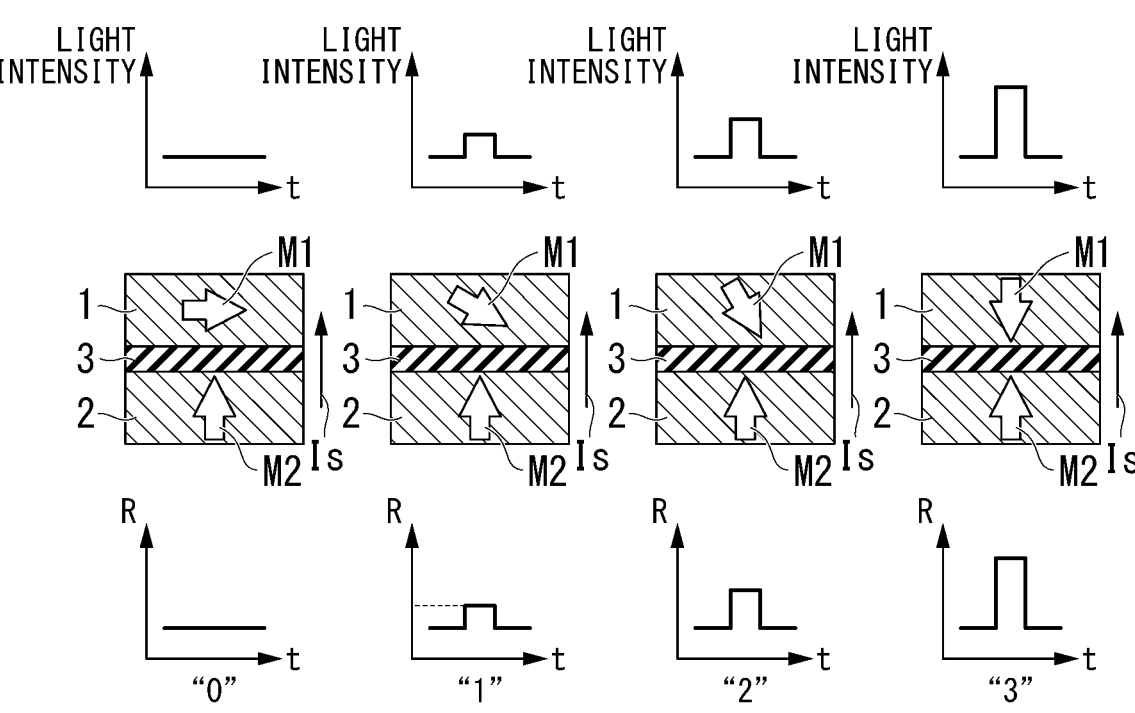
FIG. 7 is a diagram for describing yet another example of the second operation example of the light detection element according to the first embodiment.

FIGS. 6 and 7 are diagrams for describing another example of the second operation example of the light detection element 100 according to the first embodiment. In FIGS. 6 and 7, only the light-sensitive layer 10 of the light detection element 100 is extracted and illustrated. In FIGS. 6 and 7, the flow direction of the sense current Is applied to the light detection element 100 is different. In FIG. 6, sense current Is flows from the first ferromagnetic layer 1 to the second ferromagnetic layer 2. In FIG. 7, the sense current Is flows from the second ferromagnetic layer 2 to the first ferromagnetic layer 1.

In both cases of FIGS. 6 and 7, spin-transfer torque acts on the magnetization M1 in the initial state due to the sense current Is flowing through the light detection element 100. In the case of FIG. 6, the spin-transfer torque acts such that the magnetization M1 is parallel to the magnetization M2 of the second ferromagnetic layer 2. In the case of FIG. 7, the spin-transfer torque acts such that the magnetization M1 is antiparallel to the magnetization M2 of the second ferromagnetic layer 2. In both cases of FIGS. 6 and 7, because the effect of magnetic anisotropy on the magnetization M1 is greater than the effect of the spin-transfer torque in the initial state, the magnetization M1 is oriented in any one direction within the xy-plane.

When the intensity of the light applied to the light-sensitive layer 10 increases, the magnetization M1 of the first ferromagnetic layer 1 is tilted from the initial state due to external energy generated by the application of the light. This is because the sum of the effect of the light applied to the magnetization M1 and the effect of the spin-transfer torque is greater than the effect of the magnetic anisotropy associated with the magnetization M1. When the intensity of the light applied to the light-sensitive layer 10 increases, the magnetization M1 in the case of FIG. 6 is tilted such that it is parallel to the magnetization M2 of the second ferromagnetic layer 2 and the magnetization M1 in the case of FIG. 7 is tilted such that it is antiparallel to the magnetization M2 of the second ferromagnetic layer 2. Because the direction of the spin-transfer torque acting on the magnetization M1 is different, the tilt direction of the magnetization M1 in FIGS. 6 and 7 is different.

When the intensity of light applied to the light-sensitive layer 10 increases, the resistance value of the light detection element 100 decreases and the output voltage from the light detection element 100 decreases in the case of FIG. 6. In the case of FIG. 7, the resistance value of the light detection element 100 increases and the output voltage from the light detection element 100 increases.

When the intensity of the light applied to the light-sensitive layer 10 returns to the first intensity, the state of the magnetization M1 of the first ferromagnetic layer 1 returns to the original state due to the effect of the magnetic anisotropy on the magnetization M1. As a result, the light detection element 100 returns to its initial state.

Here, an example in which the first ferromagnetic layer 1 is an in-plane magnetization film and the second ferromagnetic layer 2 is a perpendicular magnetization film has been described, but the relationship may be reversed. That is, in the initial state, the magnetization M1 may be oriented in the z-direction and the magnetization M2 may be oriented in any one direction within the xy-plane.

As described above, the light detection element 100 according to the first embodiment can replace the light with an electrical signal by replacing the light applied to the light-sensitive layer 10 with the output voltage from the light detection element 100.

Also, in the light detection element 100, the second electrode 22 is made of a prescribed material. The second electrode 22 can reflect more incident light reaching the second electrode 22 than when it is not made of a prescribed material. Incident light and reflected light from the second electrode 22 are applied to the light-sensitive layer 10. When the amount of reflected light from the second electrode 22 increases, even if the amount of light incident on the light detection element 100 is small, a large amount of light can be applied to the light-sensitive layer 10. Therefore, the light detection element 100 has a high efficiency for converting incident light for the light detection element 100 into an electrical signal and a high light detection capability.

Figure 8:
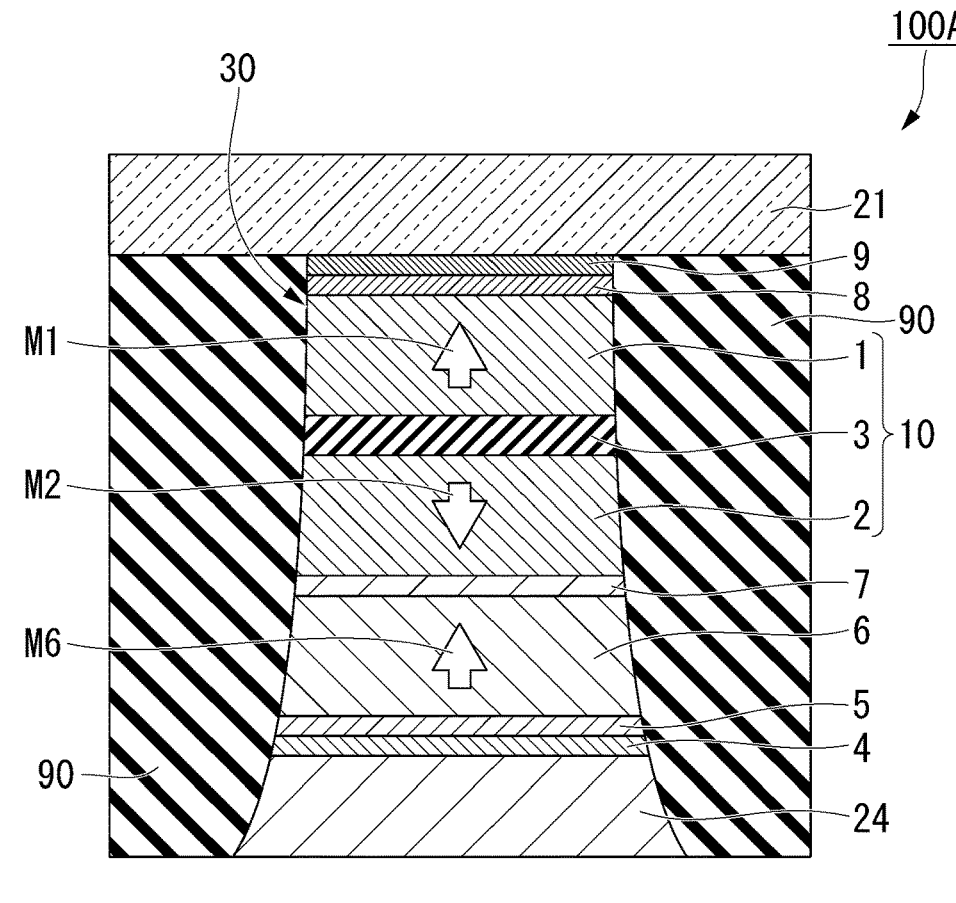
FIG. 8 is a cross-sectional view of a light detection element according to a first modified example.
Figure 8:
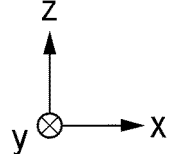

Although an example of the disclosure has been described above using the first embodiment as an example, the disclosure is not limited to this embodiment. For example, FIG. 8 is a cross-sectional view of a light detection element 100A according to a first modified example.

In the light detection element 100A according to the first modified example, the shape of the second electrode 24 is different from that of the second electrode 22 according to the first embodiment. The second electrode 24 includes a material that is similar to that of the second electrode 22. The second electrode 24 is a metal containing at least one element selected from the group consisting of ruthenium, molybdenum, and tungsten. The widths of the second electrode 24 in the x- and y-directions are narrower than the widths of the second electrode 22 in the x- and y-directions.

The widths of the second electrode 24 in the x- and y-directions are narrower than the widths of the first electrode 21 in the x- and y-directions. For example, the second electrode 24 forms a columnar body together with the laminate 30 including the light-sensitive layer 10. For example, the side surface of the second electrode 24 is continuous with the side surface of the laminate 30 including the light-sensitive layer 10. There is no step between the side surface of the second electrode 24 and the side surface of the laminate 30 including the light-sensitive layer 10.

In the light detection element 100A according to the first modified example, because the second electrode 24 is made of a prescribed material, most of the incident light reaching the second electrode 24 can be reflected, for example, on the interface between the buffer layer 4 and the second electrode 24. Therefore, the light detection element 100A according to the first modified example can obtain an effect similar to that of the light detection element 100 according to the first embodiment. Also, when the light detection element 100A is manufactured, it is possible to prevent a part of the second electrode 24 from adhering to the side surface of the laminate 30 (prevent redeposition from occurring) by processing the second electrode 24 together with the laminate 30 including the light-sensitive layer 10.

The light detection elements according to the above embodiments and modified examples can be applied to transmission/receiving devices of communication systems, light sensor devices such as image sensors, and the like.

Figure 9:
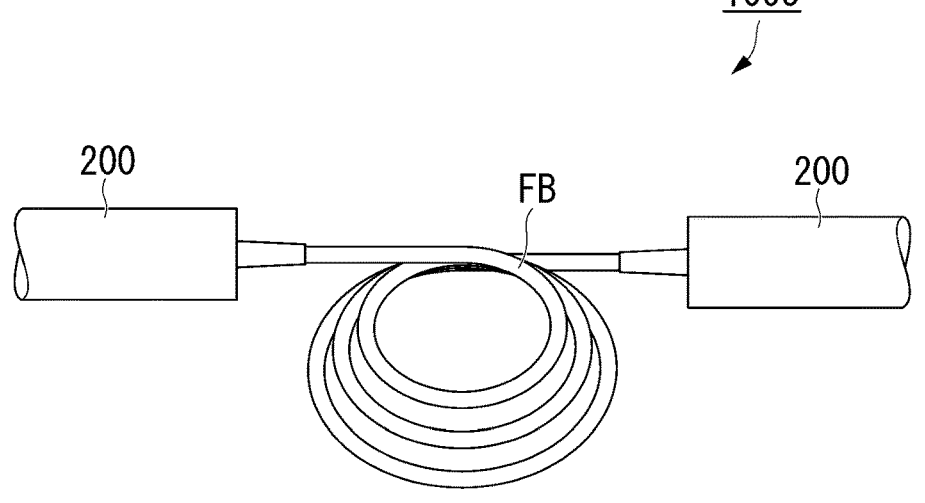
FIG. 9 is a schematic diagram of a first application example of the light detection element.

FIG. 9 is a conceptual diagram of a communication system 1000 according to the first application example. The communication system 1000 shown in FIG. 9 includes a plurality of transmitting and receiving devices 200 and an optical fiber FB that connects the transmitting and receiving devices 200. The communication system 1000 may be used, for example, for short- and medium-range communications within and between data centers and long-distance communications between cities. The transmitting and receiving device 200 is installed, for example, within the data center. The optical fiber FB connects, for example, the data centers. The communication system 1000 performs, for example, communication between the transmitting and receiving devices 200 via the optical fiber FB. The communication system 1000 may perform wireless communication between the transmitting and receiving devices 200 without involving the optical fiber FB.

Figure 10:
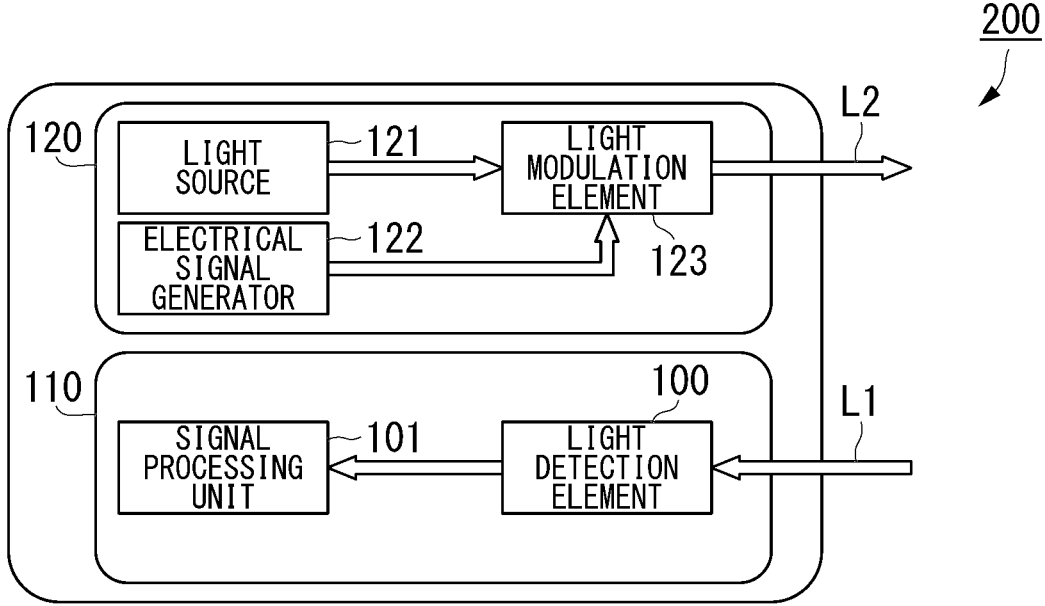
FIG. 10 is a block diagram of a transmitting and receiving device according to the first application example.

FIG. 10 is a block diagram of the transmitting and receiving device 200 according to the first application example. The transmitting and receiving device 200 includes a receiving device 110 and a transmitting device 120. The receiving device 110 receives an optical signal L1 and the transmitting device 120 transmits an optical signal L2. The light used for transmission and reception is, for example, light with a wavelength of 400 nm or more and 1500 nm or less or near-infrared light with a wavelength of 800 nm or more and 1700 nm or less.

The receiving device 110 includes, for example, a light detection element 100 and a signal processing unit 101. The light detection element 100 may be replaced with the light detection element 100A. The light detection element 100 converts the optical signal L1 into an electrical signal. Light including the optical signal L1 having a change in an intensity of light is applied to the light-sensitive layer 10. A lens may be disposed on the first electrode 21 side in the lamination direction of the light detection element 100, such that light condensed through the lens may be applied to the light-sensitive layer 10. The lens may be formed in a wafer process of forming the light detection element 100. Also, the light passing through the waveguide may be applied to the light-sensitive layer 10. The light applied to the light-sensitive layer 10 is, for example, laser light. The signal processing unit 101 processes the electrical signal obtained in the conversion process of the light detection element 100. The signal processing unit 101 receives a signal included in the optical signal L1 by processing the electrical signal generated from the light detection element 100.

Figure 11:
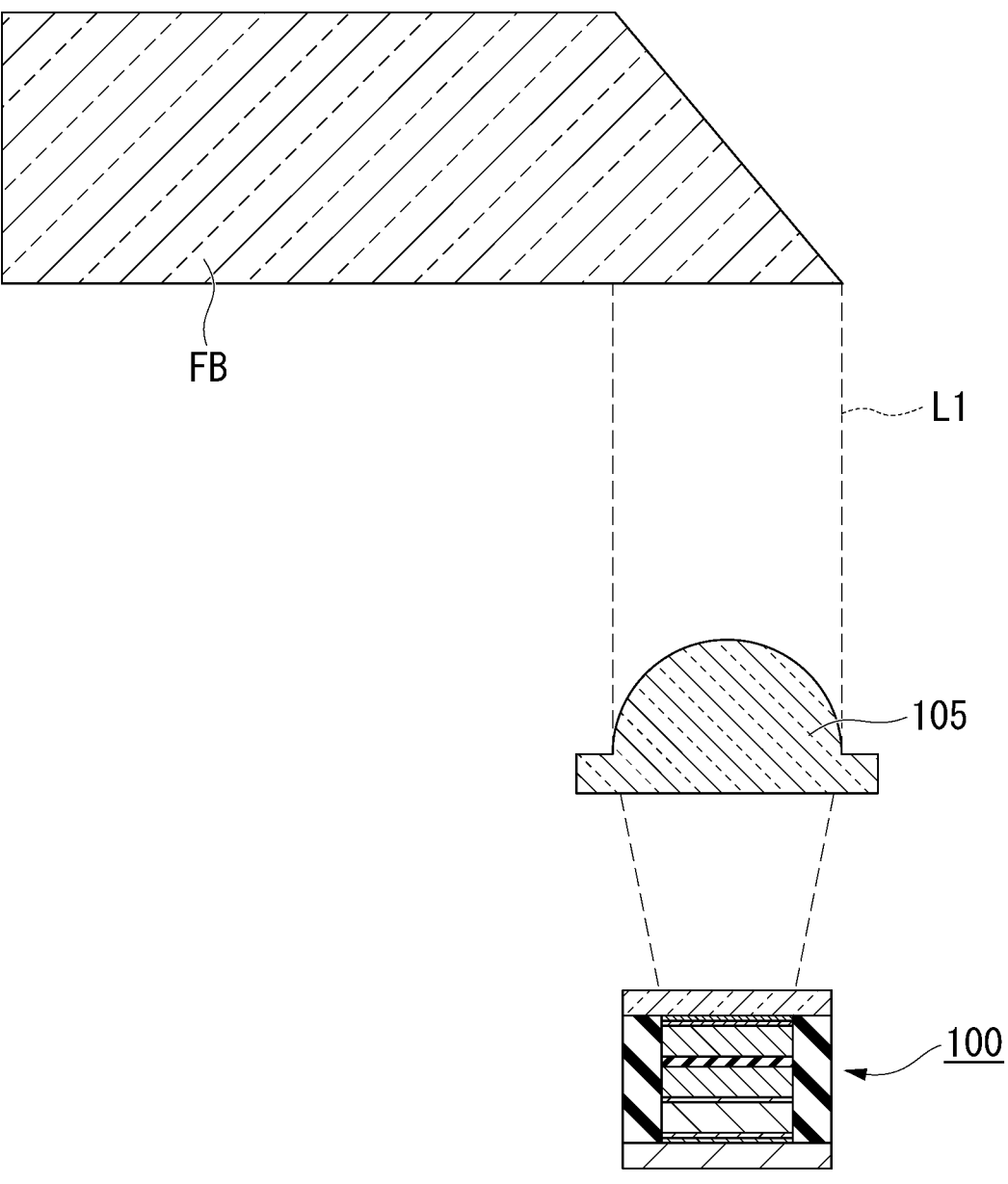
FIG. 11 is a schematic diagram of an enlarged area near a light detection element of the transmitting and receiving device according to the first application example.

FIG. 11 is a schematic diagram of an enlarged area near the light detection element 100 of the transmitting and receiving device 200 according to the first application example. For example, light propagated through an optical fiber FB, which is a waveguide, is condensed by a lens 105 and reaches the light detection element 100. The lens 105 is, for example, a micro-lens.

The transmitting device 120 includes, for example, a light source 121, an electrical signal generator 122, and a light modulation element 123. The light source 121 is, for example, a laser element. The light source 121 may be located outside of the transmitting device 120. The electrical signal generator 122 generates an electrical signal on the basis of the transmission information. The electrical signal generator 122 may be integrated with the signal conversion element of the signal processing unit 101. The light modulation element 123 modulates light output from the light source 121 on the basis of the electrical signal generated by the electrical signal generator 122 and outputs the optical signal L2.

Although an example in which the transmitting and receiving device is applied to the communication system 1000 shown in FIG. 9 has been described above, the communication system is not limited to this case.

Figure 12:
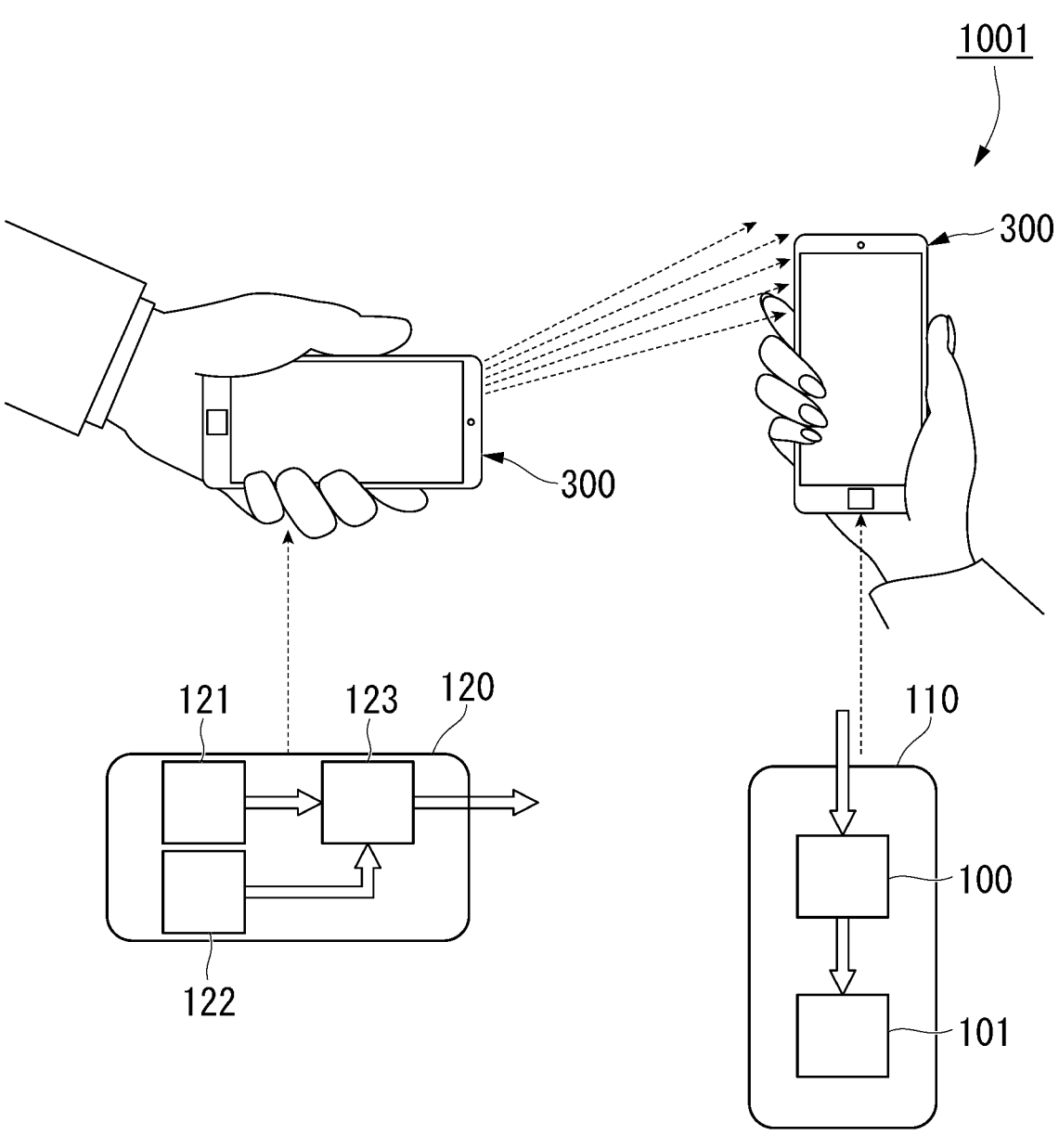
FIG. 12 is a conceptual diagram of an example of a communication system.

For example, FIG. 12 is a conceptual diagram of an example of a communication system. A communication system 1001 shown in FIG. 12 performs communication between two portable terminal devices 300. The portable terminal device 300 is, for example, a smartphone, a tablet, or the like.

Each of the portable terminal devices 300 includes a receiving device 110 and a transmitting device 120. An optical signal transmitted from the transmitting device 120 of one portable terminal device 300 is received by the receiving device 110 of another portable terminal device 300. Light used for transmission and reception between the portable terminal devices 300 is, for example, visible light ray. As the light detection element 100 of each receiving device 110, the above-described light detection element is applied.

Figure 13:
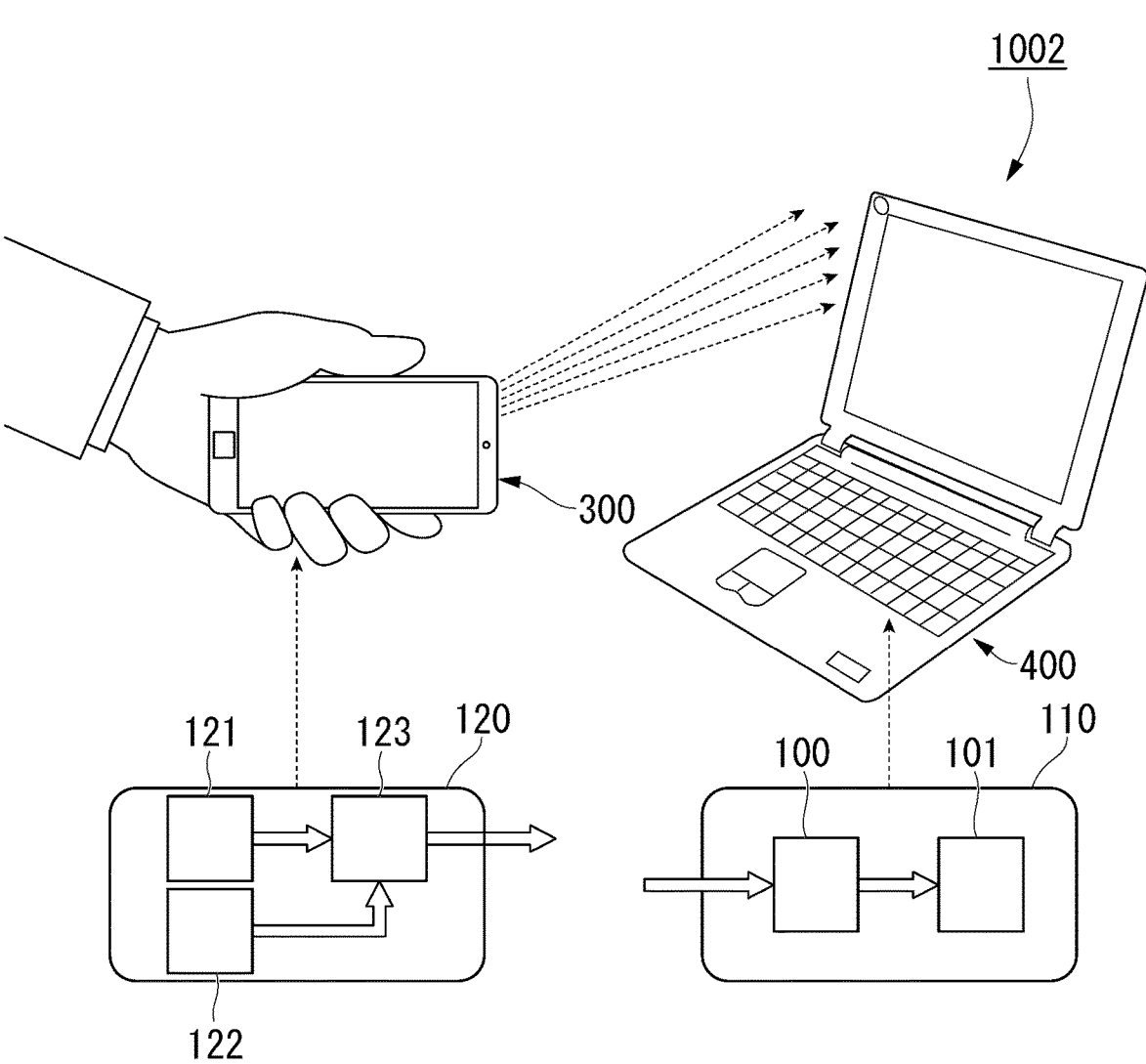
FIG. 13 is a conceptual diagram of another example of the communication system.

For example, FIG. 13 is a conceptual diagram of another example of the communication system. A communication system 1002 shown in FIG. 13 performs communication between a portable terminal device 300 and an information processing device 400. The information processing device 400 is, for example, a personal computer.

The portable terminal device 300 includes a transmitting device 120 and the information processing device 400 includes a receiving device 110. An optical signal transmitted from the transmitting device 120 of the portable terminal device 300 is received by the receiving device 110 of the information processing device 400. Light used for transmission and reception between the portable terminal device 300 and the information processing device 400 is, for example, visible light. As the light detection element 100 of each receiving device 110, the light detection element described above is applied.

Figure 14:
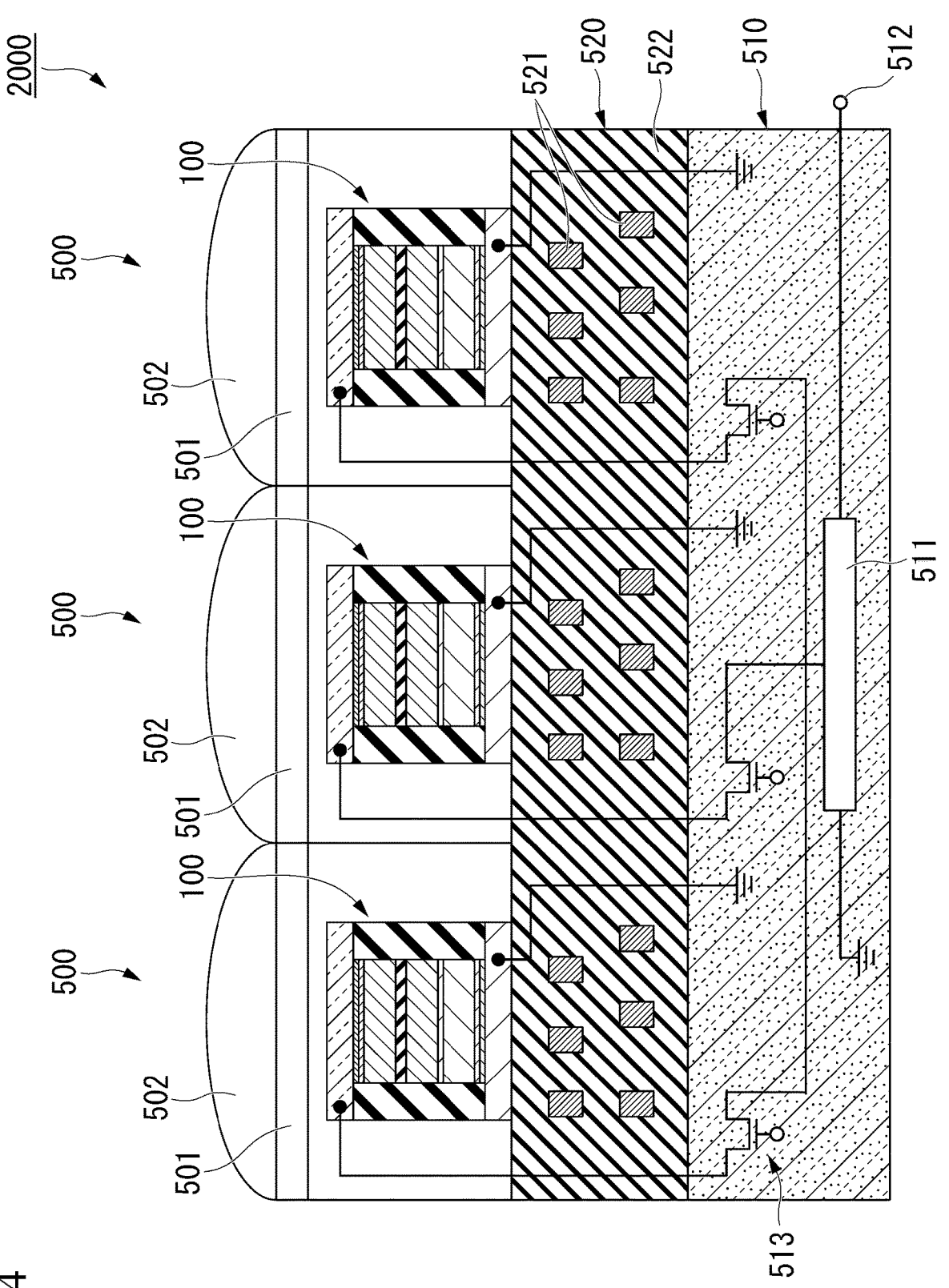
FIG. 14 is a schematic diagram of a second application example of the light detection element.

FIG. 14 is a conceptual diagram of a cross-section of the light sensor device 2000 according to the second application example. The light sensor device 2000 includes, for example, a circuit substrate 510, a wiring layer 520, and a plurality of light sensors 500. The wiring layer 520 and each of the light sensors 500 are formed on the circuit substrate 510.

Each of the light sensors 500 has, for example, a light detection element 100, a wavelength filter 501, and a lens 502. The light detection element 100 may be replaced with a light detection element 100A. The light detection element 100 converts light applied to the light-sensitive layer 10 into an electrical signal, as described above. The light detection element 100 may operate in the second operation example.

The wavelength filter 501 selects light of a specific wavelength and transmits light of a specific wavelength range. The wavelength ranges of light transmitted by the wavelength filters 501 may be the same or different. For example, the light sensor device 2000 may include a light sensor 500 (hereinafter referred to as a blue sensor) having a wavelength filter 501 for transmitting blue light (a wavelength range of 380 nm or more and less than 490 nm), a light sensor 500 (hereinafter referred to as a green sensor) having a wavelength filter 501 for transmitting green light (a wavelength range of 490 nm or more and less than 590 nm), and a light sensor 500 (hereinafter referred to as a red sensor) having a wavelength filter 501 for transmitting red light (a wavelength range of 590 nm or more and less than 800 nm). By arranging the blue sensor, the green sensor, and the red sensor as one pixel and arranging the pixels, the light sensor device 2000 can be used as an image sensor.

The lens 502 condenses light toward the light detection element 100. The light condensed by passing through the lens 502 is applied to the light-sensitive layer 10. Although one light detection element 100 is disposed below one wavelength filter 501 in the light sensor 500 shown in FIG. 14, a plurality of light detection elements 100 may be disposed below one wavelength filter 501.

The circuit substrate 510 has, for example, an analog-digital converter 511 and an output terminal 512. An electrical signal sent from the light sensor 500 is replaced with digital data by the analog-digital converter 511 and is output from the output terminal 512.

The wiring layer 520 has a plurality of wirings 521. There is an interlayer insulating film 522 between the plurality of wirings 521. The wiring 521 is electrically connected between each of the light sensors 500 and the circuit substrate 510 and is electrically connected to each calculation circuit formed on the circuit substrate 510. Each of the light sensors 500 and the circuit substrate 510 are connected, for example, via through-wiring passing through the interlayer insulating film 522 in the z-direction. Noise can be reduced by shortening an inter-wiring distance between each of the light sensors 500 and the circuit substrate 510.

The wiring 521 has conductivity. The wiring 521 is, for example, Al, Cu, or the like. The interlayer insulating film 522 is an insulator that provides insulation between the wirings of the multilayer wiring and between the elements. The interlayer insulating film 522 is, for example, an oxide, a nitride, or an oxynitride of Si, Al, or Mg. The interlayer insulating film 522 is, for example, silicon oxide ($SiO_x$), silicon nitride ($SiN_x$), silicon carbide (SiC), chromium nitride, silicon nitride (SiCN), silicon oxynitride (SiON), aluminum oxide ($Al_2O_3$), zirconium oxide ($ZrO_x$), or the like.

Figure 15:
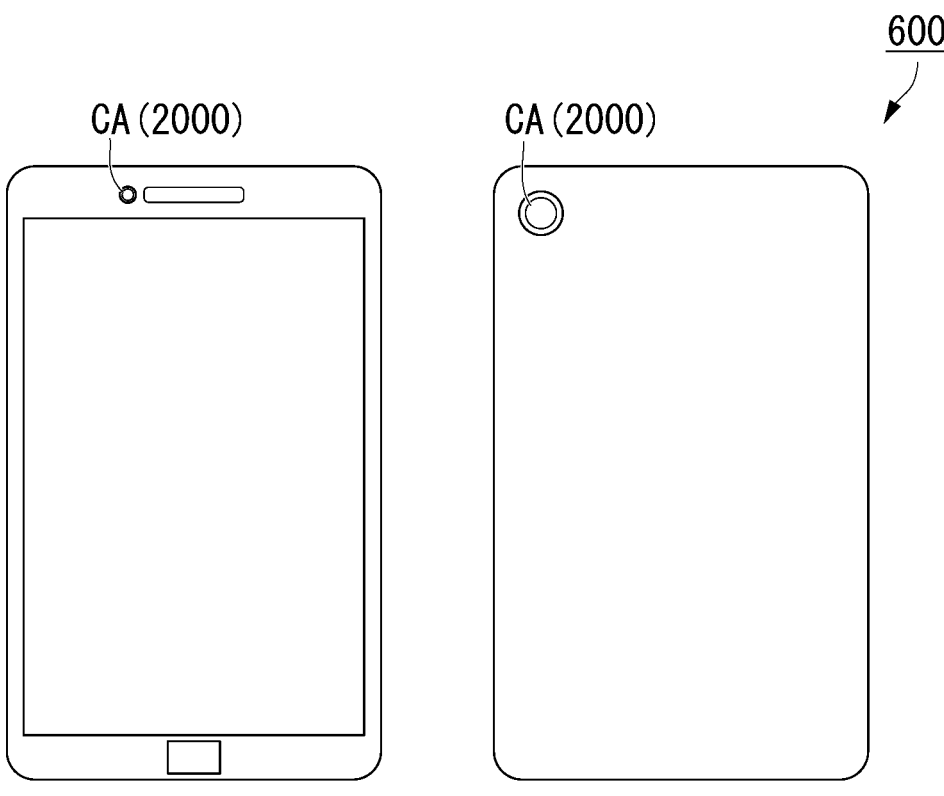
FIG. 15 is a schematic view of an example of a terminal device.

The above-described light sensor device 2000 can be used, for example, in a terminal device. FIG. 15 is a schematic view of an example of a terminal device 600. The left side of FIG. 15 is a front surface of the terminal device 600 and the right side of FIG. 15 is a back surface of the terminal device 600. The terminal device 600 has a camera CA. The above-described light sensor device 2000 can be used as an image sensor of this camera CA. Although a smartphone is shown as an example of the terminal device 600 in FIG. 15, the disclosure is not limited to this case. The terminal device 600 is, for example, a tablet, a personal computer, a digital camera, or the like other than the smartphone.

Although an example in which the light detection elements 100 and 100A are applied to a receiving device or a light sensor device such as an image sensor has been described above, the disclosure is not limited to this case. The light detection elements 100 and 100A can replace conventional semiconductor light detection elements for other various purposes. The light detection element according to the disclosure has a high light detection capability.

While embodiments of the disclosure have been described and illustrated above, it should be understood that these are exemplary of the disclosure and are not to be considered as limiting. Additions, omissions, substitutions, and other modifications can be made without departing from the spirit or scope of the disclosure. Accordingly, the disclosure is not to be considered as being limited by the foregoing description, and is only limited by the scope of the appended claims.

EXPLANATION OF REFERENCES

1 First ferromagnetic layer
2 Second ferromagnetic layer
3 Spacer layer
4 Buffer layer
5 Seed layer
6 Third ferromagnetic layer
7 Magnetic coupling layer
8 Perpendicular magnetization inducing layer
9 Cap layer
10 Light-sensitive layer
21 First electrode
22, 24 Second electrode
90 Insulating layer

100, 100A Light detection element
101 Signal processing unit
105, 502 Lens
110 Receiving device
120 Transmitting device
121 Light source
122 Electrical signal generator
123 Light modulation element
200 Transmitting and receiving device
300 Portable terminal device
400 Information processing device
500 Light sensor
501 Wavelength filter
510 Circuit substrate
511 Analog-digital converter
512 Output Terminal
520 Wiring layer
521 Wiring
522 Interlayer insulating film
600 Terminal device
1000, 1001, 1002 Communication system
2000 Light sensor device
CA Camera
FB Optical fiber
What is claimed is:
1. A light detection element comprising:
a light-sensitive layer configured to generate a voltage when light is applied;

a first electrode; and
a second electrode,
wherein
  the light-sensitive layer is located between the first electrode and the second electrode,
  the second electrode is a metal containing at least one element selected from the group consisting of ruthenium, molybdenum, and tungsten, and
  the light-sensitive layer includes a first ferromagnetic layer, a second ferromagnetic layer, and a spacer layer located between the first ferromagnetic layer and the second ferromagnetic layer.

2. The light detection element according to claim 1, wherein the first electrode is a transparent electrode.

3. The light detection element according to claim 1, wherein light having a wavelength of 400 nm or more and 1500 nm or less is applied to the light-sensitive layer.

4. The light detection element according to claim 2, wherein light having a wavelength of 400 nm or more and 1500 nm or less is applied to the light-sensitive layer.

5. The light detection element according to claim 1, wherein a thickness of the first ferromagnetic layer is 1 nm or more and 5 nm or less.

6. The light detection element according to claim 1, wherein the spacer layer has a thickness of 0.5 nm or more to 5 nm or less.

* * * * *